United States Patent [19]

Torok et al.

[11] 4,161,789

[45] Jul. 17, 1979

[54] CROSS-TAIL SENSOR FOR CROSS-TIE MEMORY

[75] Inventors: Ernest J. Torok, St. Paul; Maynard C. Paul, Bloomington; David S. Lo, Burnsville, all of Minn.

[73] Assignee: Sperry Rand Corporation, New York, N.Y.

[21] Appl. No.: 921,695

[22] Filed: Jul. 3, 1978

[51] Int. Cl.² .............................................. G11C 19/08
[52] U.S. Cl. ..................................... 365/87; 365/172
[58] Field of Search ......................... 365/87, 171, 172

[56] References Cited

U.S. PATENT DOCUMENTS

| | | | |
|---|---|---|---|
| 3,432,828 | 3/1969 | Barker et al. | 365/171 |
| 4,034,359 | 7/1977 | Torok et al. | 365/87 |
| 4,080,591 | 3/1978 | Torok | 365/87 |

*Primary Examiner*—James W. Moffitt
*Attorney, Agent, or Firm*—Kenneth T. Grace; William E. Cleaver; Marshall M. Truex

[57] ABSTRACT

A method of and an apparatus for reading out the information that is stored in a magnetizable layer that is formed of a thin film in which data are stored as inverted Neel wall sections about associated Bloch-lines along a cross-tie wall. The apparatus utilizes a magnetizable layer which is configured into a strip whose two opposing edges are, along its longitudinal axis, formed into mirror-imaged, spaced-apart, repetitive, asymmetrically-shaped patterns which repetitive patterns are formed of successive narrow portions that form wide portions therebetween. The repetitive patterns, when suitable magnetic fields are coupled thereto, form a cross-tie wall along the longitudinal axis of the strip while structuring the cross-ties along the cross-tie wall at the narrow portions and the Bloch-lines along the cross-tie walls and between the adjacent narrow portions. One of the repetitive patterns is configured into a sharp film whose longitudinal axis is transverse the strip's longitudinal axis and whose transverse axis is along the strip's longitudinal axis. The sharp film, in the area extending beyond the strip's two opposing edges, comprises an open flux path film that possesses the characteristic of shape anisotropy providing a magnetic easy axis that is generally oriented along the sharp film's longitudinal axis and along which the sharp film's remanent magnetization resides wherein for all points on the sharp film's edge the angle $\beta'$ between the sharp film's edge and the sharp film's longitudinal axis is equal to or greater than 0° and less than 45°. Also disclosed is a detector that is associated with the sharp film for reading out the orientation of the sharp film's remanent magnetization along the sharp film's easy axis.

3 Claims, 14 Drawing Figures

CROSS-TAIL SENSOR FOR CROSS-TIE MEMORY

BACKGROUND OF THE INVENTION

The propagation of inverted Néel wall sections instead of magnetic bubbles in a serial accessed memory system was proposed by L. J. Schwee in the publication "Proposal On Cross-tie Wall and Bloch-line Propagation In Thin Magnetic Films," IEEE Transactions on Magnetics, MAG 8, No. 3, pages 405-407, September, 1972. Such a memory system utilizes a ferromagnetic film strip of approximately 81% Ni - 19% Fe approximately 350 Angstroms (Å) thick in which cross-tie walls can be changed to Néel walls and Néel walls can be changed to cross-tie walls by applying appropriate fields. Associated with the cross-tie wall is a section of inverted Néel wall that is bounded by a cross-tie on one end and a Bloch-line on the other end.

In such a cross-tie wall memory system, information is entered at one end of the serial access memory system by the generation of an inverted Néel wall section, formed by a cross-tie on one side and a Bloch-line on the other, that is representative of a stored binary 1 or of a non-inverted Néel wall section (i.e., the absence of a cross-tie, Bloch-line pair) that is representative of a stored binary 0. Such information is moved or propagated along the cross-tie wall by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections through successive memory cells along the cross-tie walls. In the L. J. Schwee U.S. Pat. No. 3,868,660; in a Naval Ordinance Laboratory Report NOLTR 73-185, and in the publication "Cross-tie Memories Simplified By The Use of Serrated Strips," L. J. Schwee, et al., AIP Conference Proceedings, No. 29, 21st Annual Conference on Magnetism and Magnetic Materials, 1975, published April, 1976, pages 624-625, there have been published some recent results of the further development of cross-tie wall memory systems and of detectors for the readout of binary information that is stored therein.

In a cross-tie wall memory system, the selective generation and propagation of the digital data representing inverted Néel wall sections about associated cross-ties and Bloch-lines have been demonstrated in the laboratory. Additionally, it has been shown that the data track of a cross-tie wall memory system may be configured into a film strip having repetitive patterns of asymmetrically serrated edge contours. Such film strip configurations are disclosed in the L. H. Johnson, et al., U.S. Pat. No. 4,075,612 and the L. J. Schwee U.S. Pat. No. 3,868,660, and in the publication "Cross-tie Memories Simplified by the Use of Serrated Strips," L. J. Schwee, et al., AIP Conference Proceedings, No. 29, 21st Annual Conference on Magnetism and Magnetic Materials, 1975, published April, 1976, pages 624-625. More recently it has been proposed to construct cross-tie wall memory systems from a plurality of data tracks, each of which is formed as a strip of isotropic magnetic film, i.e., a film having substantially zero uniaxial anisotropy. The data-track-defining strip of isotropic magnetic film utilizes its shape, i.e., its edge contour, induced anisotropy, rather than its easy axis magnetic field induced anisotropy, to constrain the cross-tie wall within the planar contour of the film strip. The use of the shape induced anisotropy of an isotropic strip of magnetic film permits the use of nonlinear, i.e., curved, data tracks which may be configured into cross-tie wall memory systems that perform both memory and logic functions. Such a system is disclosed in the E. J. Torok U.S. Pat. No. 4,075,613.

Although the generation, propagation and logic manipulation of inverted-Néel-wall-section-defining data bits and the detection or readout thereof have received considerable study, one area that can still use improvement in the development of a workable cross-tie wall memory system is the detector or the device that reads out the information that is stored in the cross-tie wall memory system. Many such detectors or readout devices have been found to be workable and are disclosed in the patent literature—see the D. S. Lo, et al., U.S. Pat. No. 4,001,795;E. J. Torok, et al., U.S. Pat. No. 4,024,515; E. J. Torok U.S. Pat. No. 4,024,516; and the E. J. Torok, et al., U.S. Pat. No. 4,034,359. The present invention is directed toward an improved method of and an apparatus for reading out the information that is stored in a cross-tie wall memory system.

SUMMARY OF THE INVENTION

In the present invention, the prior art film strip, whose two opposing edges are formed into mirror-image, repetitive patterns of successive narrow portions that form wide portions therebetween in which the Bloch-line is structured, is modified wherein one of the repetitive patterns is configured into a sharp film such as described in the P. D. Barker, et al., U.S. Pat. No. 3,432,828. This film is isotropic, i.e., has substantially zero magnetic field induced anisotropy, and utlizes its shape, i.e., its edge contour, to constrain the cross-tie wall within the planar contour of and along the longitudinal axis of the film strip, with the sharp film, as an integral part of the film strip, also being isotropic. The sharp film, whose logitudinal axis is transverse the film strip's longitudinal axis and whose transverse axis is along the film strip's longitudinal axis, extends beyond the film strip's two opposing edges for forming an open flux path film possessing the characteristic of shape anisotropy. The sharp film's shape anisotropy provides therein a magnetic easy axis that is generally oriented along the sharp film's longitudinal axis and along which the sharp film's remanent magnetization resides. Associated with the sharp film is a detector or readout device for reading out the orientation of the sharp film's remanent magnetization along the sharp film's longitudinal axis as being in a first or a second and opposite polarization therealong.

DESCRIPTION OF THE PREFERRED EMBODIMENTS

Figure 1:
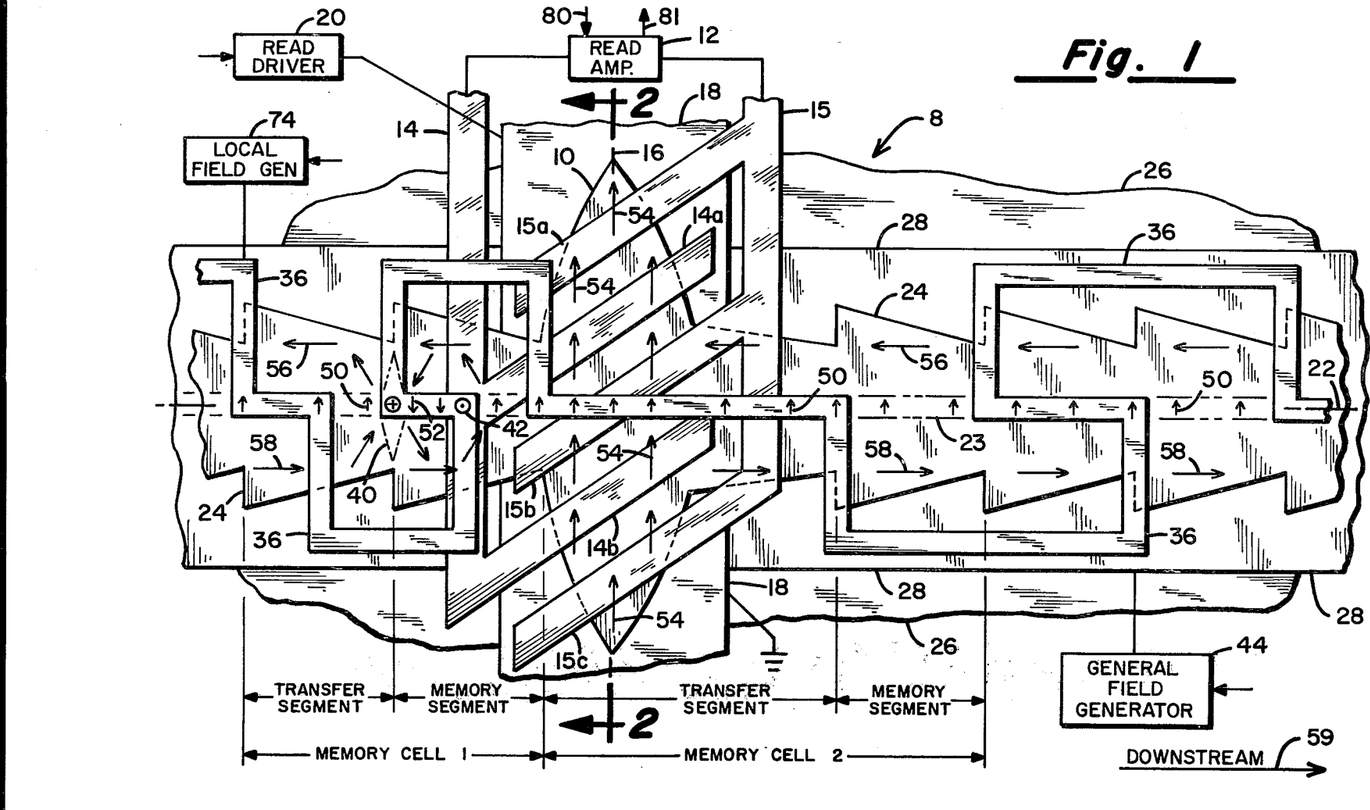
FIG. 1 is a schematic illustration of a portion of a cross-tie wall memory system illustrating, in detail, the detector of the present invention.

FIG. 1 is an illustration of a portion of a prior art cross-tie memory system into which the detector 8 of the present invention is incorporated. Detector 8 is comprised of: sharp film 10; read amplifier 12; detector arms 14 and 15 having the associated leads 14a, 14b and 15a, 15b, 15c; microstrip 18; and, read driver 20. In the area of sharp film 10, the remanent magnetization of sharp film 10 is detected as lying in a first or second and opposite orientation substantially along the longitudinal axis 16 of sharp film 10, which longitudinal axis 16 is substantially perpendicular to the longitudinal axis 22 of the data track or film strip 24.

Figure 2:
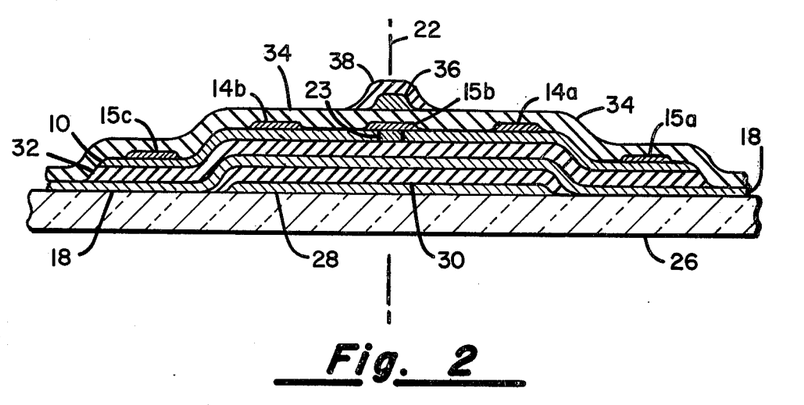
FIG. 2 is an illustration of a cross-section of the memory plane of FIG. 1 taken along line 2—2 thereof illustrating the stacked, superposed elements of FIG. 1.

The memory system of FIGS. 1, 2 includes a non-magnetizable, e.g., glass, substrate member 26 having the following active members arranged in a stacked, superposed integral assembly; conductive, e.g., gold, microstrip 28; conductive, e.g., gold, microstrip 18; magnetizable, e.g., NiFe, data track 24; conductive, e.g., gold, detector arms 14, 15; and conductive, e.g., gold, drive line 36. Not illustrated in FIG. 1, but illustrated in FIG. 2, are thin, smoothing and insulating layers of, e.g., SiO, between the conductive elements—insulative layer 30 between microstrip 28 and microstrip 18 and insulative layer 32 between microstrip 18 and sharp film 10 of data track 24. Additionally, not illustrated in either FIG. 1 or FIG. 2, a thin adhesive layer of, e.g., chromium, may be affixed to the top and/or the bottom surfaces of the metallic elements for ensuring an integral assembly of the metallic elements with the adjacent insulative layers. Still further, superposed this entire assembly and affixed to the top surface thereof, there is provided an SiO sealing and insulative layer.

With respect to substrate 26, microstrip 28, and driveline 36, such configurations may be similar to that of the D. S. Lo, et al., U.S. Pat. No. 3,906,466. Additionally, with respect to data track 24, it may be configured in the manner as taught in the L. J. Schwee U.S. Pat. No. 3,868,660 and in the publication "Cross-tie Memories Simplified by the Use of Serrated Strips," L. J. Schwee, et al., AIP Conference Proceedings, No. 29, 21st Annual Conference on Magnetism and Magnetic Materials, 1975, published April, 1976, pages 624–625; or in the manner as taught by the L. H. Johnson, et al., U.S. Pat. No. 4,075,612. With respect to the particular configuration or embodiment of data track 24, it, as stated hereinabove, is preferably configured into a film strip whose two opposing edges are formed into mirror-imaged, repetitive patterns of successive narrow portions that form wide portions therebetween in which the Bloch-line is structured, and in which one of such repetitive patterns is modified wherein one of the repetitive patterns is configured into a sharp film 10 such as described in the T. D. Barker, et al., U.S. Pat. No. 3,432,828. Preferably the film strip is isotropic, i.e., has substantially zero magnetic field induced anisotropy, and utilizes its shape, i.e., its edge contour, to constrain the cross-tie wall within the planar contour of and along the longitudinal axis of the film strip with the sharp film 10 as an integral part of the film strip, also being isotropic.

However, it is to be noted that data track 24 may be configured into a film strip whose two opposing edges are parallel, straight lines along which the positioning of the Bloch-line is structured solely by the configuration of the driveline 36 such as taught in the E. J. Torok U.S. Pat. No. 4,075,613.

With particular reference to FIG. 2, there is presented a cross-sectional view of the detector 8 of FIG. 1 taken along line 2—2 thereof for the purpose of illustrating the configuration of the stacked, superposed elements of FIG. 1. FIG. 2 illustrates that detector 8 includes the following listed successive layers:

| | |
|---|---|
| Glass substrate 26 | — 0.50 mm thick |
| Chromium adhesive layer | — 200 Å thick |
| Gold microstrip 28 | — 5000 Å thick |
| Chromium adhesive layer | — 200 Å thick |
| SiO insulative layer 30 | — 10,000 Å thick |
| Chromium adhesive layer | — 200 Å thick |
| Gold microstrip 18 | — 5000 Å thick |
| Chromium adhesive layer | — 200 Å thick |
| SiO insulative layer 32 | — 10,000 Å thick |
| Permalloy data track 24 and sharp film 10 | approx. 81% Ni - 19% Fe, — 350 Å thick |
| Chromium adhesive layer | — 200 Å thick |
| Gold detector arms 14, 15 | — 5000 Å thick |
| Chromium adhesive layer | — 200 Å thick |
| SiO insulative layer 34 | — 10,000 Å thick |
| Chromium adhesive layer | — 200 Å thick |
| Gold drive line 36 | — 40,000 Å thick |
| Chromium adhesive layer | — 200 Å thick |
| SiO insulative layer 38 | — 10,000 Å thick. |

It is to be noted that the chromium adhesive layers are not explicitly illustrated as having substantial thicknesses in FIG. 2. This presentation is to present a more meaningful but simplified illustration of the stacked relationship of the active elements of detector 8 and in which the relative dimensions of the elements of FIGS. 1 and 2 are not to be construed as a limitation thereto.

Figure 3A:
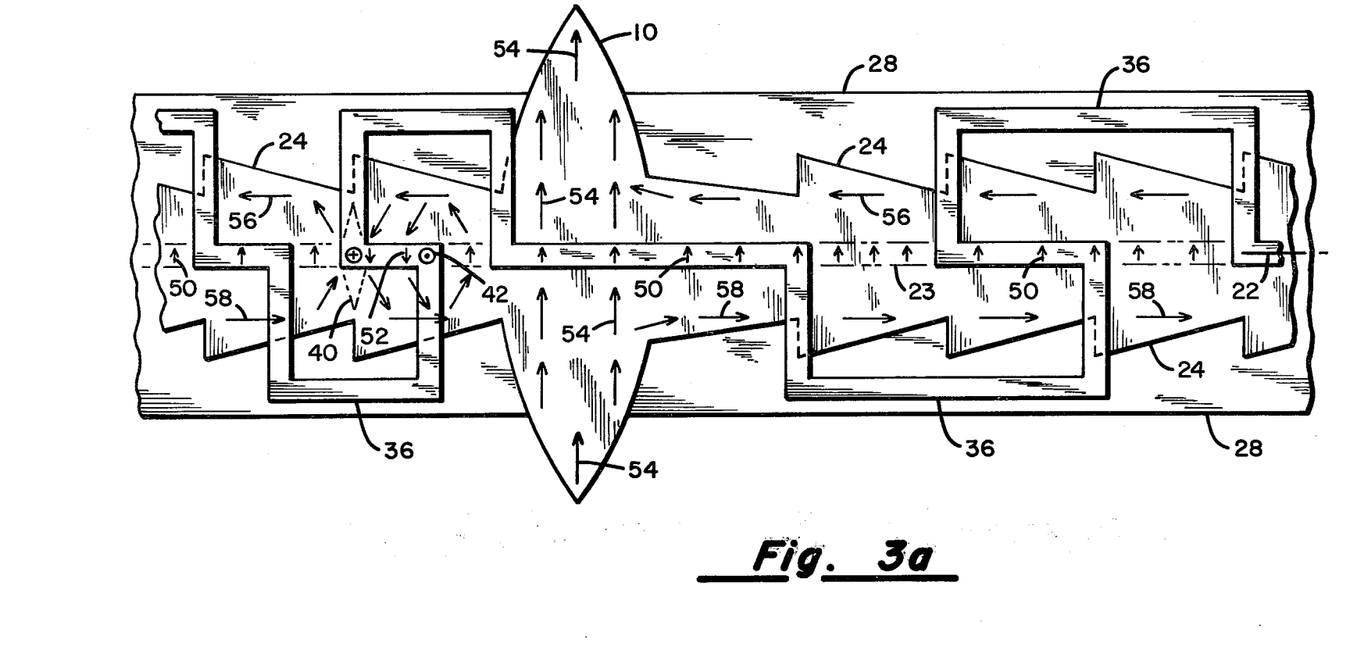
FIGS. 3a through 3g are schematic representations of the vector orientations of the magnetization along the length of the film strip for the propagate signal waveforms of FIG. 4.
Figure 3B:
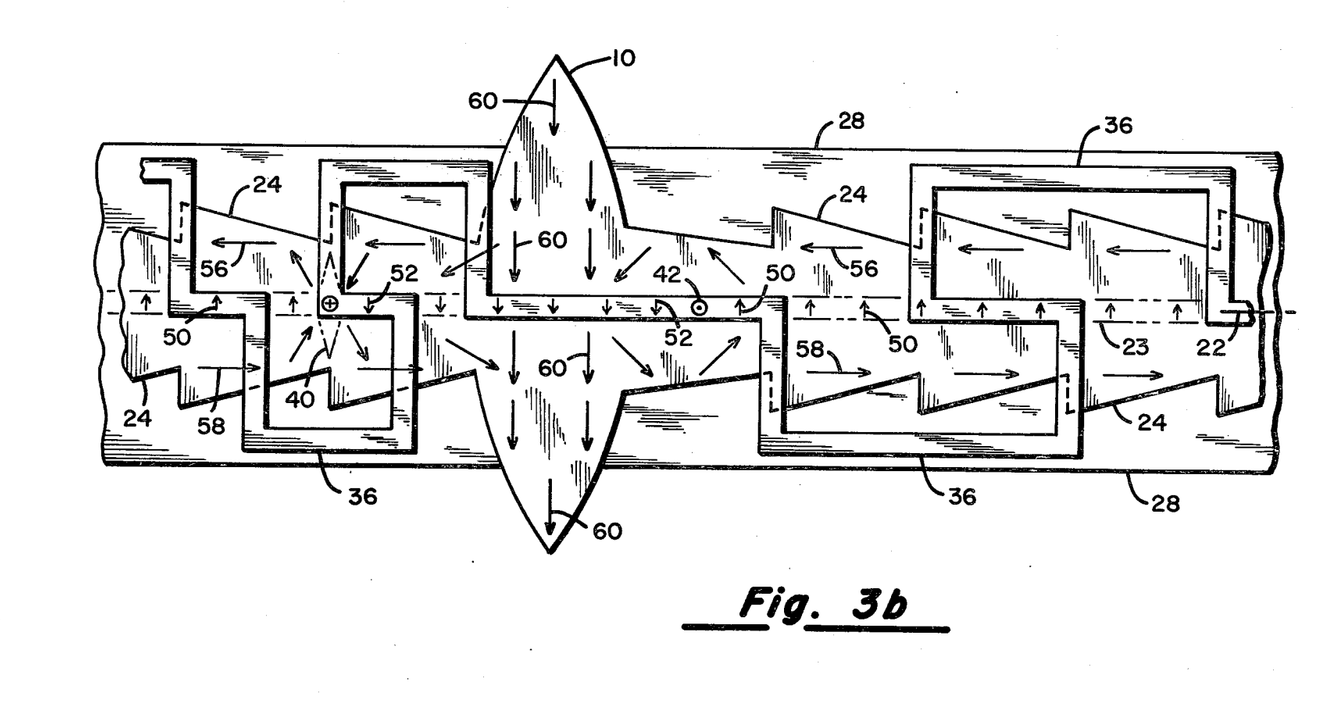
Figure 3C:
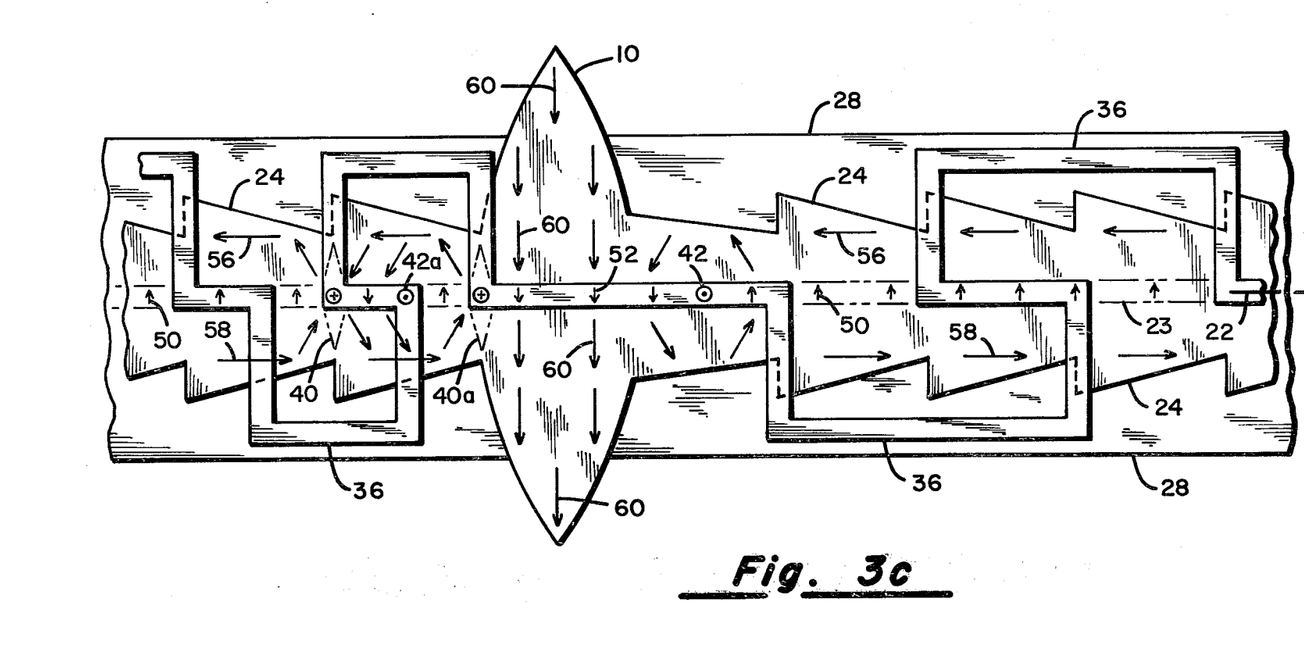
Figure 3D:
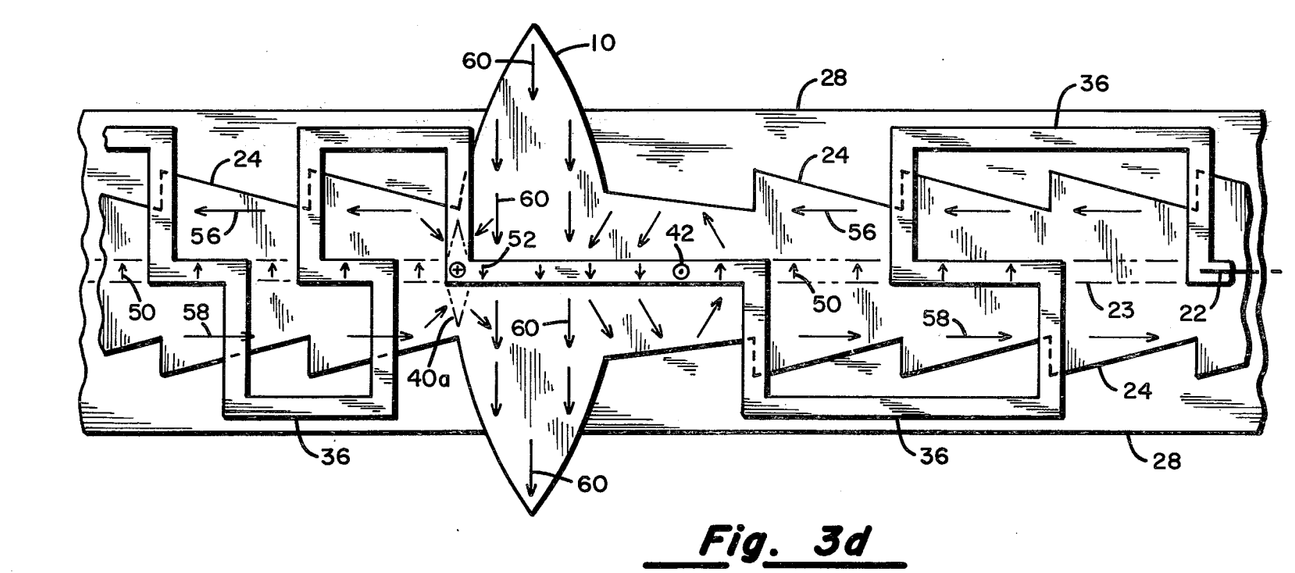
Figure 3E:
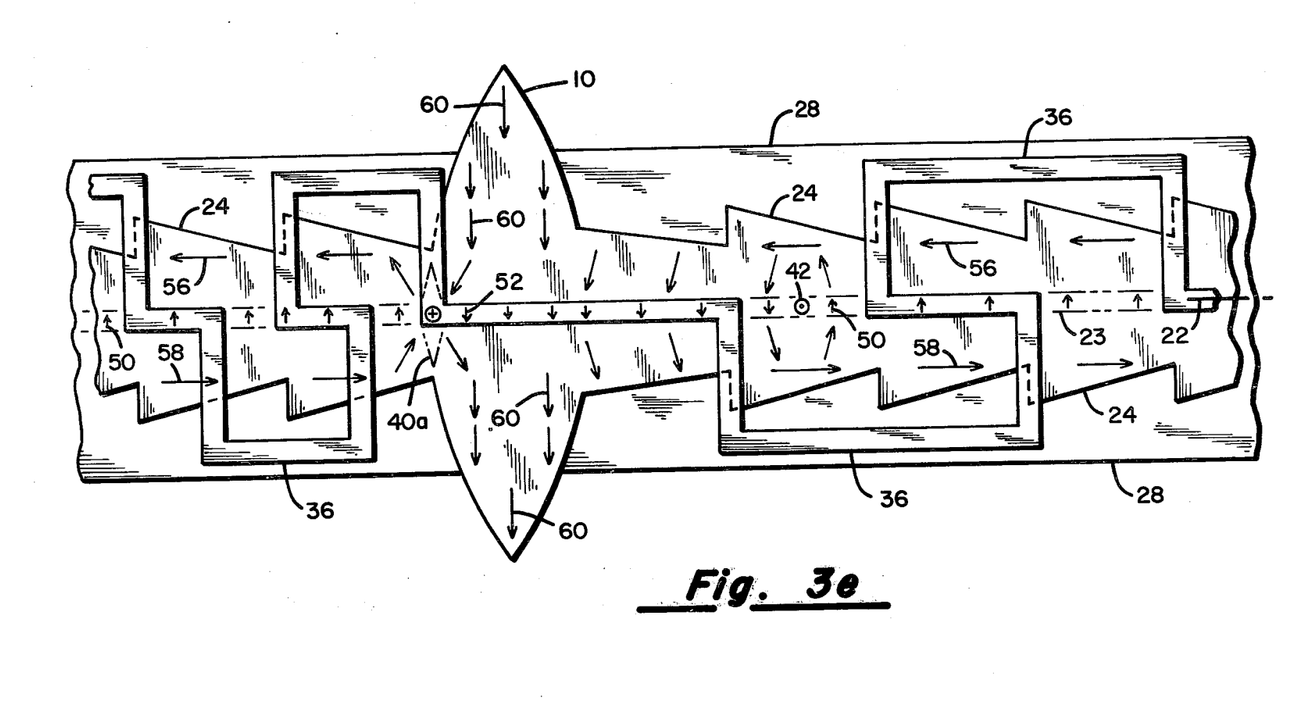
Figure 3F:
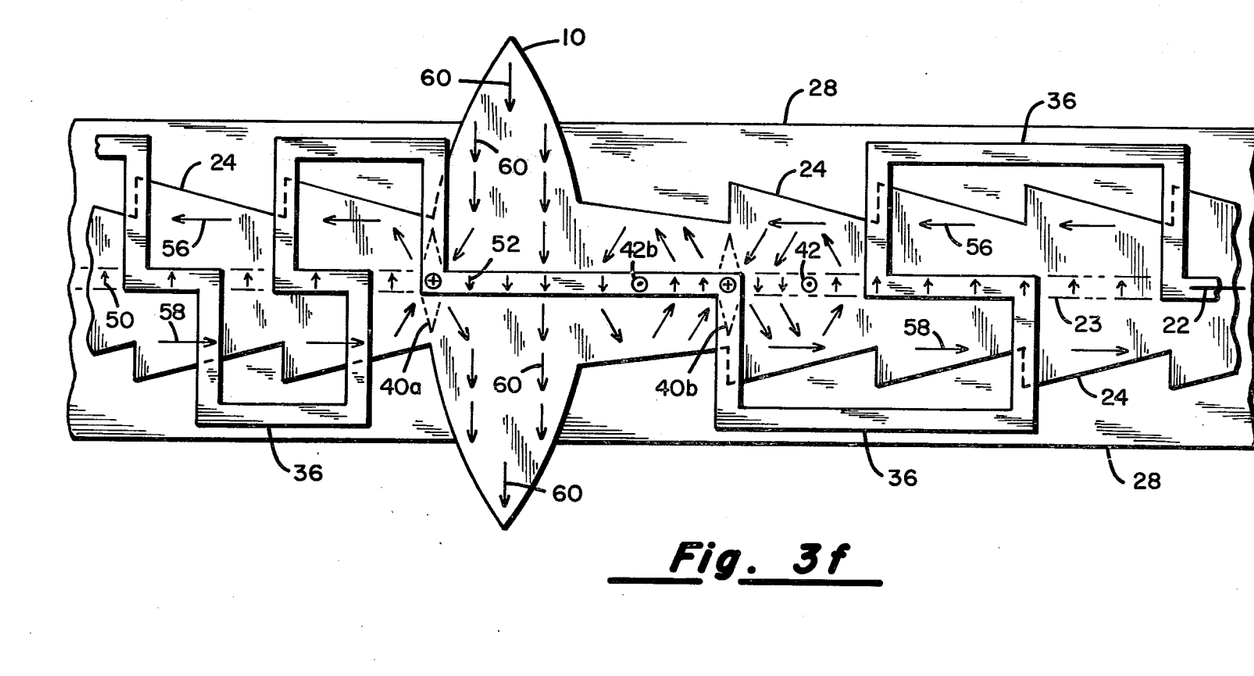
Figure 3G:
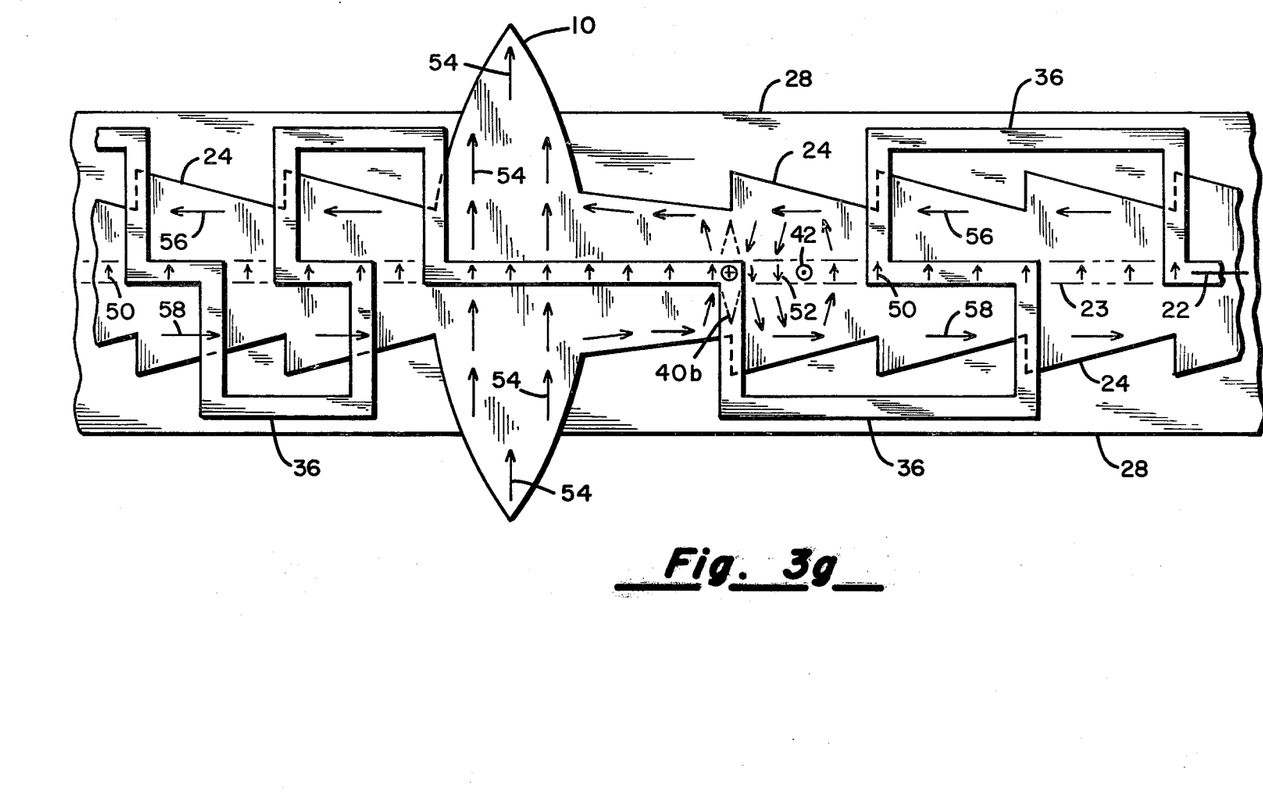
Figure 4:
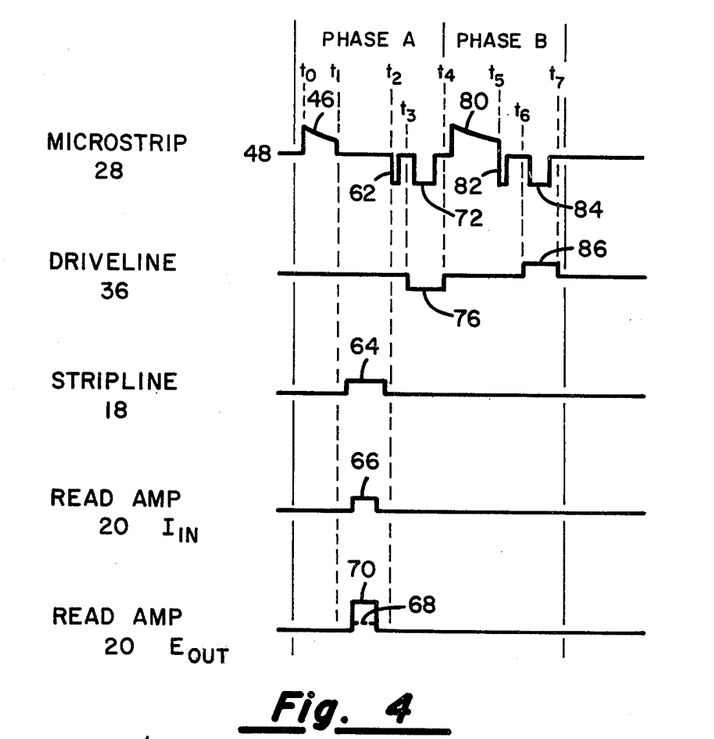
FIG. 4 is an illustration of the waveforms of the signals utilized to propagate and readout the inverted Néel wall sections along the cross-tie wall in the cross-tie wall memory system of FIG. 1.

With particular reference to FIGS. 3a through 3g, there are presented schematic illustrations of the vector orientations of the magnetization along the length of the magnetic data track 24 and within the sharp film 10 when subjected to the signal waveforms of FIG. 4.

Initially assume that at a time prior to time $t_0$ the magnetic conditions of data track 24 are as illustrated in FIGS. 1 and 3a in which a cross-tie 40, Bloch-line 42 pair are illustrated as being positioned in the memory segment of memory cell 1 which is immediately to the left of sharp film 10; sharp film 10 forms part, the first or left-hand one half portion, of the transfer segment of memory cell 2.

As is well known—see the D. S. Lo U.S. Pat. No. 3,906,466 —the cross-tie, Bloch-line pairs are serially propagated from memory cell to memory cell along the cross-tie wall 23 in a two-step procedure. In this procedure, the Bloch-line is propagated away or downstream from the associated cross-tie, a new Bloch-line, cross-tie pair is inserted between the separated cross-tie, Bloch-line pair and then the cross-tie of the separated cross-tie, Bloch-line pair and the Bloch-line of the inserted Bloch-line, cross-tie pair are annihilated, leaving, in effect, a propagated cross-tie, Bloch-line pair which has been propagated from the memory section of an upstream memory cell, e.g., memory cell 1, into the transfer section and then into the memory section of the next adjacent downstream memory cell, e.g., memory cell 2. The present invention and the discussion thereof will only be directed toward the propagation of the cross-tie, Bloch-line pair from memory cell 1 into memory cell 2, it being understood that the cross-tie, Bloch-line pairs may be propagated along data track 24 in the well-known manner.

Next, assume that after a time $t_0$ field generator 44 couples to microstrip 28 the phase A pulse 46 of signal 48, the leading edge of which starts to propagate Bloch-line 42 out of the memory segment of memory cell 1 in a rightward downstream direction toward the transfer section of memory cell 2. FIGS. 1 and 3a depict, at a time prior to time $t_0$, that the magnetization polarization in cross-tie wall 23 is normally in an upwardly direction as denoted by vectors 50; however, in the inverted Néel wall section between cross-tie 40 and Bloch-line 42 the magnetic polarization in cross-tie wall 23 is in a downwardly direction as denoted by vectors 52, while the magnetization polarization in sharp film 10 is in the upwardly direction denoted by vectors 54. Also note that the magnetization polarizations in data track 24 above and below the cross-tie wall 23 are in a leftward upstream direction denoted by vectors 56 and a rightward downstream direction denoted by vectors 58, respectively.

When Bloch-line 42 is propagated in a downstream direction, as denoted by vector 59, by the phase A pulse 46, it switches the magnetization in cross-tie wall 23 from the upwardly direction of vectors 50 to the downwardly direction of vectors 52; however, the magnetic polarization along the top and bottom serrated edges of the data track 23 remain in their leftward and rightward directions of vectors 56 and 58, respectively, due to the shape anisotropy of the serrated edges. As Bloch-line 42 is propagated along cross-tie wall 23 through sharp film 10 it switches the magnetization in cross-tie wall 23 from the upwardly direction of vector 50 into the downwardly direction of vector 52, while also switching the magnetization polarization of sharp film 10 from the upwardly direction denoted by vectors 54 to the downwardly direction denoted by vectors 60—see FIG. 3b.

At time $t_1$, phase A pulse 46 is terminated, whereupon Bloch-line 42 comes to rest in a stable position within the transfer section of memory cell 2 near the righthand end thereof as defined by the narrow portion of data track 24. This magnetic polarization in data track 24 is then, at time $t_1$, as illustrated in FIG. 3b.

At time $t_2$, after the termination of the phase A pulse 46, general field generator 44 couples a phase A pulse 62 to microstrip 28. Phase A pulse 62 generates between the separated cross-tie 40 and Bloch-line 42 and inserts therebetween a Bloch-line 42a, cross-tie 40a pair. After the termination of the phase A pulse 62, as at time $t_3$, the magnetization polarization within data track 24 is as illustrated in FIG. 3c.

Figure 5A:
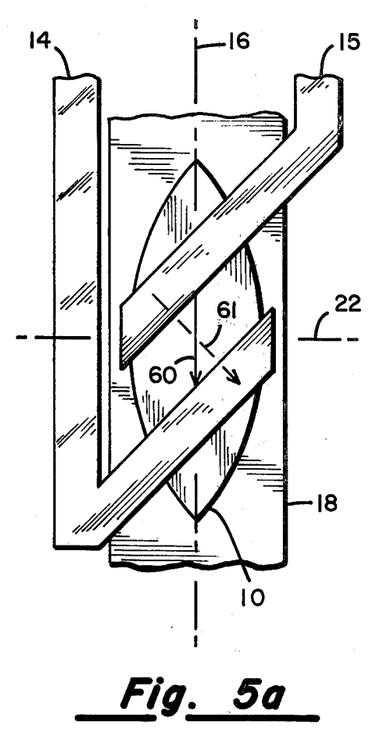
FIGS. 5a and 5b are schematic illustrations of the effect of the readout signal of FIG. 4 upon the stored 1 and stored 0 magnetic states of the sharp film of FIG. 1.
Figure 5B:
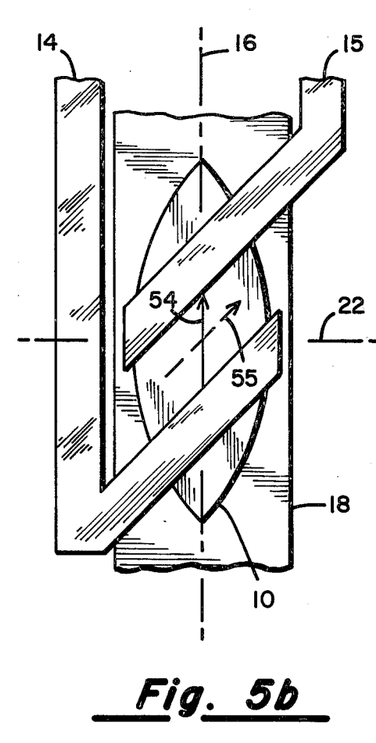

At a time between the termination of the phase A pulse 46 at time $t_1$ and the initiation of the phase A pulse 62 at time $t_2$, read driver 20 couples a read drive pulse 64 to microstrip 18. Read drive pulse 64 is directed transverse or perpendicular to the longitudinal axis 16 of sharp film 10, and, accordingly, the magnetization polarization of sharp film 10 as denoted by vector 60, denoting a stored 1 by the passage of a Bloch-line 42 therethrough, or, alternatively, as denoted by vector 54, denoting a stored 0 by the non-passage of a Bloch-line 42 therethrough. Read drive pulse 64 rotates the magnetization polarization in sharp film 10 in a counterclockwise or in a clockwise direction perpendicular to or parallel to, respectively, the longitudinal axes or length of the detector arms 14a, 14b and 15a, 15b, 15c of detector 8. Next and concurrent with the coupling of the read drive pulse 64 to stripline 18, read amplifier 20 couples a read detector pulse 66 to detector arms 14, 15 via an $I_{in}$ signal coupled to input terminal 80. If the magnetization polarization is as illustrated in FIG. 5a, denoting a stored 1 by the rotation of the vector 60 in a counterclockwise direction to vector 61, read amplifier 20 generates and provides at its output terminal 81 a relatively small amplitude $E_{out}$ signal 68. Alternatively, if the magnetization polarization is as illustrated in FIG. 5b, denoting a stored 0 by the rotation of the vector 54 in a clockwise direction to vector 55, read amplifier 20 generates and provides at its output terminal 81 a relatively large amplitude $E_{out}$ signal 70.

Next, between the times $t_3$–$t_4$, general field generator 44 couples the phase A pulse 72 to microstrip 28 while, concurrently, local field generator 74 couples to driveline 36 the phase A pulse 76. Phase A pulses 72 and 76 conjointly coact in the area of cross-tie 40, Bloch-line 42a and cross-tie 40a in data track 24 to annihilate the cross-tie 40, Bloch-line 42a pair. Accordingly, at time $t_4$, the magnetization polarization in data track 24 is as illustrated in FIG. 3d. At this time, at time $t_4$, the cross-tie, Bloch-line pair that had at a time prior to $t_0$ been stored in the memory segment of memory cell 1 has now been stored in the transfer segment of memory cell 2.

Next, during the time period $t_4$–$t_5$, general field generator 44 couples to microstrip 28 the phase B pulse 80 which propagates Bloch-line 42 from the transfer segment into the memory segment of memory cell 2. At this time, at time $t_5$, the magnetization polarization of data track 24 is as illustrated in FIG. 3e.

Next, as at time $t_5$, general field generator 44 couples to microstrip 28, phase B pulse 82 which generates and inserts between separated cross-tie 40a and Block-line 42 the Bloch-line 42b, cross-tie 40b pair. After the termination of the phase B pulse 82, as at time $t_6$, the magnetization polarization of data track 24 is as illustrated in FIG. 3f.

Lastly, during the time $t_6$–$t_7$, general field generator 44 couples to microstrip 28 phase B pulse 84 while, concurrently, local field generator 74 couples to driveline 36 phase B pulse 86. Phase B pulses 84 and 86 conjointly coact in the area of the transfer segment of memory cell 2 to annihilate cross-tie 40a and Bloch-line 42b leaving the cross-tie 40b, Bloch-line 42 pair resident or stored in the memory segment of memory cell 2. At this time, as at time $t_7$, the magnetization polarization of data track 24 is as illustrated in FIG. 3g. After this hereinabove discussed operation of cross-tie memory system of FIG. 1, as at time $t_7$, the propagation of the cross-tie, Bloch-line pairs in cross-tie wall 23 continues as in the well-known manner.

Figure 6A:
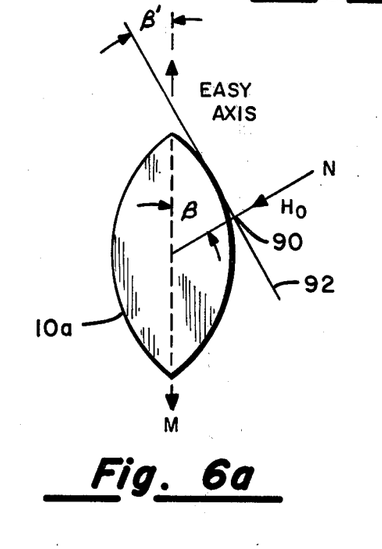
FIGS. 6a and 6b are illustrations of typical sharp film planar contours that may be incorporated in the detector of FIG. 1.
Figure 6B:
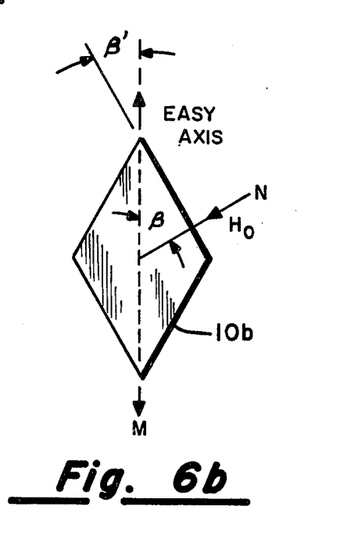

With particular reference to FIGS. 6a and 6b there are illustrated two planar contour forms of sharp film 10 as illustrated in the P. D. Barker, et al., U.S. Pat. No. 3,432,828. In FIGS. 6a and 6b there is illustrated an angle $\beta'$ that is the angle that is complementary to the angle $\beta$, or $$\beta' + \beta = 90°.$$

Film 10a of FIG. 6a is a sharp film with curved edges with the normal to the edge N defining the point 90 at the film edge at which a line 92 is tangential to the film's edge, which line 92 with the film's easy axis M defines the angle Such Barker, et al., patent teaches that for the optimum planar contours thin films should be designed having:

$$45° < \beta \leq 90°$$

$$0° \leq \beta' < 45°.$$

As is self-evident, minor deviations from such limitations may be permitted, such as the rounding off of abrupt changes of direction of the film edge.

Accordingly, it has been shown in the illustrated embodiment of the present invention that there is provided an improved detector for the readout of data stored in a cross-tie wall memory system.

What is claimed is:

1. In a magnetic memory system in which binary data are stored as magnetic vector orientations about the geometric centerline of a magnetic strip, the improvement wherein a portion of said strip is configured into a sharp film whose longitudinal axis is transverse the geometric centerline of said strip and whose transverse axis is along the geometric centerline of said strip, said sharp film extending beyond the two opposing edges of said strip for forming an open flux path film possessing the characteristic of shape anisotropy and providing a magnetic easy axis generally oriented along said longitudinal axis and along which the sharp film's remanent magnetization resides wherein for all points on the sharp film's edge the angle $\beta'$ between the sharp film's edge and the sharp film's longitudinal axis is equal to or greater than 0° and less than 45°, and means associated with said sharp film for reading out the orientation of said sharp film's remanent magnetization along said longitudinal axis.

2. In a magnetic memory system in which binary data are stored as inverted Néel wall sections about an associated Bloch-line along a wall in a magnetic layer, said magnetic layer being configured into a strip whose two opposing edges are formed about the geometric centerline of the strip, the improvement wherein a portion of said strip is configured into a sharp film whose longitudinal axis is transverse said geometric centerline and whose transverse axis is along said centerline, said sharp film in the area extending beyond said two opposing edges comprising an open flux path film possessing the characteristic of shape anisotropy providing a magnetic easy axis generally oriented along said longitudinal axis and along which the film's remanent magnetization shall reside wherein for all points on the film's edge the angle $\beta'$ between the film's edge and the film's longitudinal axis is equal to or greater than 0° and less than 45°, and means associated with said sharp film for reading out the orientation of said film's remanent magnetization along said longitudinal axis.

3. In a magnetic memory system in which binary data are stored as inverted Néel wall sections about an associated Bloch-line, which inverted Néel wall sections are generated in and are serially propagated along a wall in a magnetic layer by appropriate drive fields, said magnetic layer being configured into a strip whose two opposing edges are formed into uniformly spaced, repetitive patterns of asymmetrically shaped edges which repetitive patterns are formed of successive narrow portions forming wide portions therebetween and which are formed about the geometric centerline of the strip for establishing a wall along said geometric centerline and structuring said Bloch-line along said wall between adjacent narrow portions and in the wide portion therebetween, the improvement wherein one of the repetitive patterns is configured into a sharp film whose longitudinal axis is transverse said geometric centerline and whose transverse axis is along said centerline, said sharp film in the area extending beyond said two opposing edges comprising an open flux path film possessing the characteristic of shape anisotropy providing a magnetic easy axis generally oriented along said longitudinal axis and along which the film's remanent magnetization shall reside wherein for all points on the film's edge the angle $\beta'$ between the film's edge and the film's longitudinal axis is equal to or greater than 0° and less than 45°, and means associated with said sharp film for reading out the orientation of said film's remanent magnetization along said longitudinal axis.

* * * * *